US006784115B1

(12) United States Patent
Ni et al.

(10) Patent No.: US 6,784,115 B1
(45) Date of Patent: Aug. 31, 2004

(54) METHOD OF SIMULTANEOUSLY IMPLEMENTING DIFFERENTIAL GATE OXIDE THICKNESS USING FLUORINE BEARING IMPURITIES

(75) Inventors: Cheng-Tsung Ni, Hsinchu (TW); Jacson Liu, Hsinchu (TW); Chih-Sheng Chang, Hsinchu (TW); Hudy-Jong Wu, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/216,078

(22) Filed: Dec. 18, 1998

(51) Int. Cl.[7] .......................................... H01L 21/8246
(52) U.S. Cl. ...................... 438/770; 438/257; 438/275; 438/766; 438/911
(58) Field of Search ................................ 438/766, 770, 438/911, 25.7, FOR 108, FOR 212, FOR 395, FOR 490, FOR 496, FOR 158, 257, 201, 275

(56) References Cited

U.S. PATENT DOCUMENTS

| | | | |
|---|---|---|---|
| 4,144,100 A | | 3/1979 | MacIver et al. |
| 4,151,010 A | * | 4/1979 | Goth |
| 4,743,563 A | * | 5/1988 | Pfiester et al. |
| 4,748,131 A | | 5/1988 | Zietlow |
| 4,748,134 A | | 5/1988 | Holland et al. |
| 4,912,062 A | * | 3/1990 | Verma |
| 4,948,742 A | | 8/1990 | Nishimura et al. |
| 5,330,920 A | | 7/1994 | Soleimani et al. |
| 5,358,894 A | * | 10/1994 | Fazan et al. |
| 5,385,630 A | | 1/1995 | Philipossian et al. |
| 5,460,693 A | | 10/1995 | Moslehi |
| 5,480,828 A | | 1/1996 | Hsu et al. |
| 5,614,421 A | | 3/1997 | Yang |
| 5,920,779 A | * | 7/1999 | Sun et al. |
| 6,093,659 A | * | 7/2000 | Grider et al. |

FOREIGN PATENT DOCUMENTS

| | | | |
|---|---|---|---|
| JP | 53-83465 | * | 7/1978 |
| JP | 58-170030 | * | 6/1983 |

OTHER PUBLICATIONS

Peter J. Wright et al., *The Effect of Fluorine in Silicon Dioxide Gate Dielectrics*, IEEE Transactions on Electron Devices, vol. 36, No. 5, May, 1989, 10 pages.
G. S. Verdi, C.M.S. Rauthan, B.C. Pathak and W.S. Khokle, "Properties of the Fluorine–Implanted Si–SiO(2) System," Solid–State Electronics vol. 34, No. 8, 1991, pp. 889–892.
Xie–Wen Wang, Artur Balasinski and T. P. Ma, "Pre–Oxidation Fluorine Implantation into Si (Process–Related MOS Characteristics)", J. Electrochem Soc. vol. 139, No. 1, Jan. 1992, pp. 238–241.

* cited by examiner

*Primary Examiner*—George Fourson
*Assistant Examiner*—Joannie Adelle Garcia
(74) *Attorney, Agent, or Firm*—Townsend and Townsend and Crew, LLP

(57) ABSTRACT

Improved methods for fabricating semiconductor integrated circuit devices, in particular flash EEPROM devices. According to an embodiment, the present invention provides a method of forming a semiconductor device having a gate oxide layer (160) that is thin in some regions, such as the cell region, and thicker in other regions (165), such as the periphery region. The method simultaneously provides a gate oxide layer with two or more thicknesses without the thickness control problems of prior art methods that use contaminant-containing photoresist with an etching step. According to a specific embodiment of the present invention, the gate oxide has a first thickness that is sufficiently thin to provide high driving capability for the semiconductor ROM device, and a second thickness that is sufficiently thick to provide high voltage reliability of the semiconductor ROM device.

22 Claims, 10 Drawing Sheets

METHOD OF SIMULTANEOUSLY IMPLEMENTING DIFFERENTIAL GATE OXIDE THICKNESS USING FLUORINE BEARING IMPURITIES

BACKGROUND OF THE INVENTION

The present invention relates to semiconductor integrated circuits and their manufacture. The invention is illustrated in an example with regard to the manufacture of a read only memory ("ROM") cell, and more particularly to the manufacture of a flash electrically-erasable programmable read only memory ("Flash EEPROM") cell, but it will be recognized that the invention has a wider range of applicability. Merely by way of example, the invention may be applied in the manufacture of other semiconductor devices such as mask ROMs, embedded Flash EEPROMs, embedded DRAMs, microcontrollers, microprocessors ("MICROs"), digital signal processors ("DSPs"), application specific integrated circuits, among others.

Read only memories (ROMs) and various methods of their manufacture have been used or proposed. In the fabrication of a ROM, particularly an EEPROM, it is often necessary to fabricate a storage cell that maintains data after the applied power is turned off, that is, a storage cell having almost permanent data characteristics. The storage cells are generally mass data storage files where each cell corresponds to the presence or absence of a stored charge on a "floating" gate of a storage cell transistor. Specifically, the storage cell includes at least two conducting layers—one conducting layer is the floating gate of the storage cell transistor, and another conducting layer is the control gate for control of the cell operation. The floating gate is formed on a thin gate oxide formed on the substrate. The control gate is located above the floating gate, and the control gate and floating gate are isolated from each other by a thin dielectric layer known as an "interpoly oxide", which may typically be composed of oxide/nitride/oxide ("ONO"). In some typical EEPROMs, data are programmed into the cells by applying a high voltage to the control gate to inject hot electrons (or tunnel electrons in some devices) into the floating gate. The process of programming data is often called coding. In coding, the charge is transferred from the silicon substrate through the thin gate oxide layer to the floating gate.

In typical EEPROMs, especially for flash EEPROMs, two different gate oxide thicknesses are generally required for optimized device performance. In such devices, it is often critical to grow a high-quality, thin gate oxide (used as a tunneling oxide) in the storage cell and (used as a gate oxide) in some transistors in the periphery of the storage cell region in order to provide high driving capability for higher speed. Controlling the thickness of the thin gate oxide is crucial, especially since design rules for devices with gates are becoming increasingly smaller and require thinner gate oxides. Because high-voltage supplies are used, thicker gate oxides at the periphery of the storage cell region are needed to maintain device quality and reliability after long-term high voltage stress from the high voltages (e.g., up to or greater than ±12V) generated through a pumping circuit for the storage cell coding and/or erase. Therefore, implementing different gate oxide thicknesses in EEPROM devices is an important aspect of the fabrication of high performance devices.

Conventional methods for forming different gate oxide thicknesses in ROMs have typically involved the use of photoresist in combination with a dry or wet etch step. First, a gate oxide is grown on a silicon substrate then masked with a photoresist. The photoresist used makes physical contact with and masks a portion of the gate oxide, while the etch step completely removes a portion of the gate oxide to provide exposed substrate. Such photoresist typically contains many contaminants which degrade the ability of the gate oxide to resist long-term high voltage stresses. Then another oxidation process is performed to provide a thin oxide layer on the exposed substrate and a thicker oxide layer where the masked gate oxide was located. Use of a dry etch creates the possibility of over-etching of the gate oxide down to the silicon substrate to cause damage to the substrate and degrade the quality of the thin gate oxide layer grown on the exposed substrate. The use of a dry etch may also present problems for oxide thickness control. Further, the use of two separate oxidation steps in forming the different gate oxide thicknesses often results in slower throughput, which is inefficient for economically manufacturing high quality devices. From the above it is seen that an improved method of fabricating semiconductor devices with a reliable, high-quality gate oxide having different thicknesses is often desired. Further, more efficient methods are needed which are able to provide with adequate thickness control high-quality gate oxides, especially for increasingly smaller device dimensions, that are sufficiently thin in certain regions such as the cell regions and thicker in other regions such as periphery regions.

SUMMARY OF THE INVENTION

The present invention provides an improved method and resulting structure for an integrated circuit device. In particular, the present invention provides an improved integrated circuit and method of manufacture therefor using a novel technique that relies upon a halogen bearing impurity, e.g., fluorine, chlorine, iodine, and bromine.

In a specific embodiment, the present invention provides a method of forming a semiconductor device. The method includes the steps of providing a semiconductor substrate having a first region where a first oxide layer thickness is desired and a second region where a second oxide layer thickness is desired, and introducing halogen-containing impurities (e.g., fluorine, chlorine, bromine, iodine, or any combination thereof) into the semiconductor substrate to form a higher halogen concentration in the first region than in the second region. The method also includes the step of performing an oxidizing process on the semiconductor substrate to simultaneously form a thermal gate oxide layer having the first oxide layer thickness at the first region and the second oxide layer thickness at the second region, where the first oxide layer thickness is thicker than the second oxide layer thickness. Additional regions can also be formed using other concentrations and/or impurities to provide a structure with more than two (e.g., three, four, five, six) differing oxide or dielectric layers.

According to an alternative embodiment, the present invention provides a method of forming a semiconductor integrated circuit. The method includes the step of providing a semiconductor substrate. The semiconductor substrate includes a memory cell region, a second region for a MOS transistor, and a first region for a high voltage device. The method also includes the steps of forming a gate dielectric layer comprising an oxide overlying the semiconductor substrate including the first region and the second region, selectively implanting fluorine-containing impurities (or impurities such as chlorine, bromine, iodine, or any combination thereof) into the first region, and simultaneously forming a first thickness of dielectric material overlying the first region and forming a second thickness of dielectric material overlying the second region. The first thickness is sufficiently thick to provide high driving capability and reliability for the high voltage device, and the second thickness is sufficiently thin to provide for switching of the MOS transistor. Additional regions can also be formed using other concentrations and/or impurities to provide a structure with more than two (e.g., three, four, five, six) differing oxide or dielectric layers.

According to another embodiment, the present invention provides an integrated circuit such as a flash EEPROM semiconductor device. The device includes a semiconductor substrate, a first memory gate electrode formed on a first gate oxide layer on the semiconductor substrate with the first memory gate electrode having a width of about 0.35 µm or less, and a second gate oxide layer having a first thickness and a second thickness formed on the semiconductor substrate. The first thickness is about 70 Å or less, and the second thickness is greater than the first thickness. The device also includes a dielectric layer formed on the first memory gate electrode, and a second gate electrode formed on the dielectric layer over at least a portion of the first gate electrode. In the device, the first thickness and the second thickness of the second gate oxide layer have been grown simultaneously by oxidizing the semiconductor substrate having a higher fluorine concentration where the second thickness is grown than where the first thickness is grown. Other impurities that can be used to replace or in combination with fluorine, include chlorine, bromine, or iodine.

A further aspect of the invention provides a method and resulting structure for manufacturing integrated circuits such as flash memory devices that generally require the use of differing gate oxide thicknesses. These flash memory devices would be fabricated in an active or cell region with an oxide layer of a first thickness. A high voltage device that programs the flash memory devices would be fabricated on a non-cell or peripheral region with an oxide layer of a second thickness, which is much thicker than the first thickness, to achieve desirable device characteristics. The second thickness of oxide preferably has a fluorine bearing impurity (or impurities such as chlorine, bromine, iodine, or any combination thereof). These oxide layers would be fabricated by way of the novel techniques described herein as applied to various flash memory cell designs. These designs include, among others, a stacked cell design, a split cell design, and the like. Further details of these flash cell designs are described in more detail below.

Benefits of the various embodiments include the ability to reduce the number of steps of forming gate oxide layers, and protecting the gate oxide layer from contacting photoresist which may include some metal materials which will decay the gate oxide. Additionally, the dielectric layer for the high voltage device includes a fluorine bearing impurity. The fluorine bearing impurity increases, for example, an oxide layer thickness. Additionally, the fluorine bearing impurity in the dielectric often increase a transistor threshold voltage, and reduces leakage current noise, for example. Depending upon the embodiment, one or more of these benefits may be present. These and other benefits are described throughout the present specification.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENTS

Prior Art Fabrication Methods and EEPROM Structures

Figure 1A:
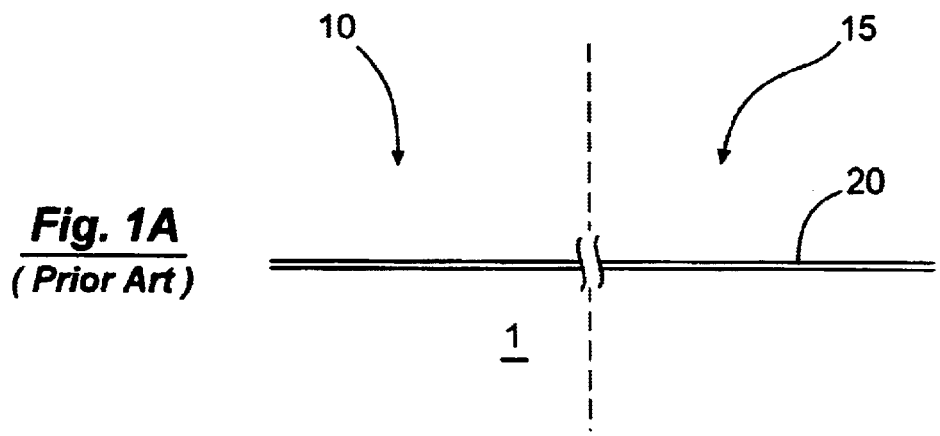
FIGS. 1A–1K are cross-sectional views of simplified prior art fabrication methods for EEPROM semiconductor devices.

A simplified prior art EEPROM fabrication process and related structures may be briefly described as follows with reference to FIGS. 1A–1K. FIGS. 1A–1K are cross-sectional views of a typical prior art method for forming a gate oxide with different thicknesses for a typical EEPROM, e.g., flash EEPROM, device. FIG. 1A shows a semiconductor substrate 1, such as silicon, with a gate oxide layer 20 formed thereon by a first thermal oxidation process. Typically gate oxide layer 20 has a thickness of about 30–250 Å, and is formed by a thermal oxidation process (e.g., subjecting the silicon substrate to an oxygen-containing environment in a thermal oxidation furnace). As seen in FIG. 1A, a cell region 10 and a periphery region 15 for a typical prior art EEPROM device are shown. Each cell in cell region 10 corresponds to a region for storing a bit of information in a EEPROM semiconductor integrated circuit chip. Thousands and even millions of these microscopically small regions make up a core memory area (or active cell area) of the EEPROM chip. Typically in a completed EEPROM chip, cell region 10 will include multiple storage cell transistors (not shown), and periphery region 15 will include peripheral driver transistors, high-voltage power supply circuitry, interconnects and bonding pads, etc. For FIGS. 1A–1K, different regions are shown separated by double wavy lines to indicate the existence of other structures (e.g., isolation structures like isolation trenches or field oxide, etc.) separating the regions.

Figure 1B:
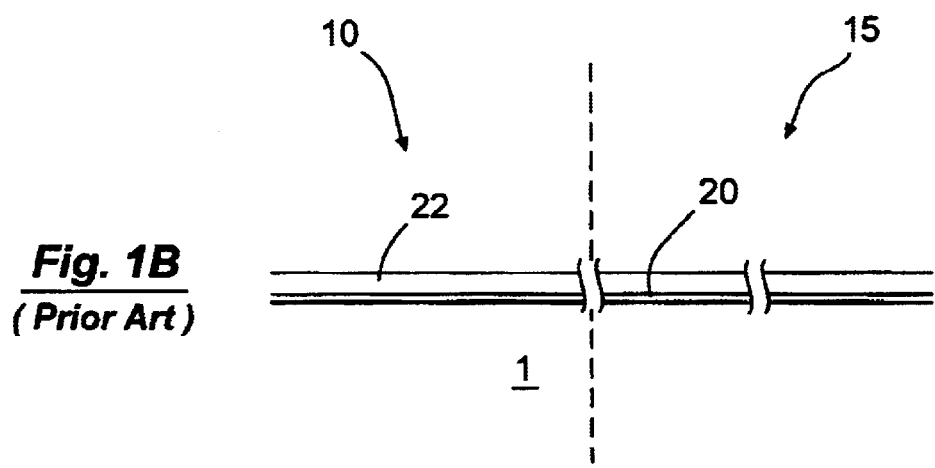
Figure 1C:
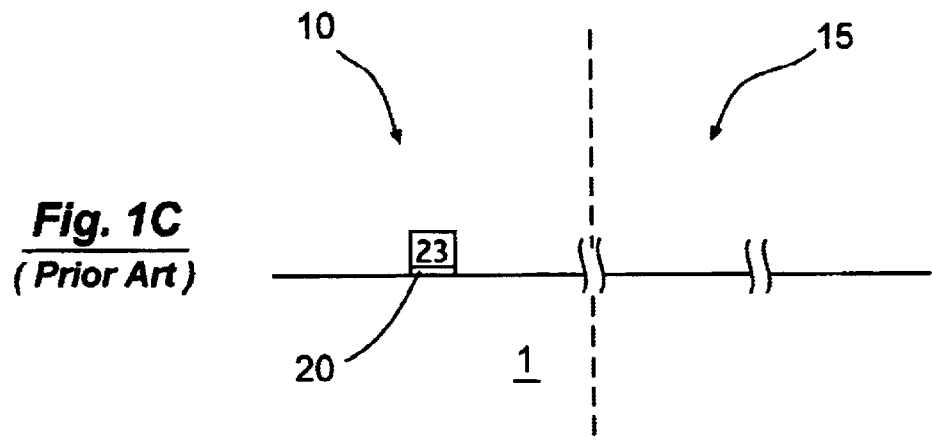

As seen in FIG. 1B, a first conducting layer 22, which may be polysilicon, is formed by chemical vapor deposition over oxide layer 20 which acts as the tunnel oxide in cell region 10. Of course, to improve electrode conductivity, the first conducting layer may be in situ doped or doped subsequent to deposition. Then, a photoresist is formed on first conducting layer 22 and patterned to define a floating gate 25 in cell region 10. Then, an etch step is performed to form the floating gate 25, and the photoresist is removed. Portions of oxide layer 20 not covered by floating gate 25 are also removed when the photoresist is removed. Any remnants of such portions of oxide layer 20 are removed by a pre-clean step following removal of the photoresist.

Figure 1D:
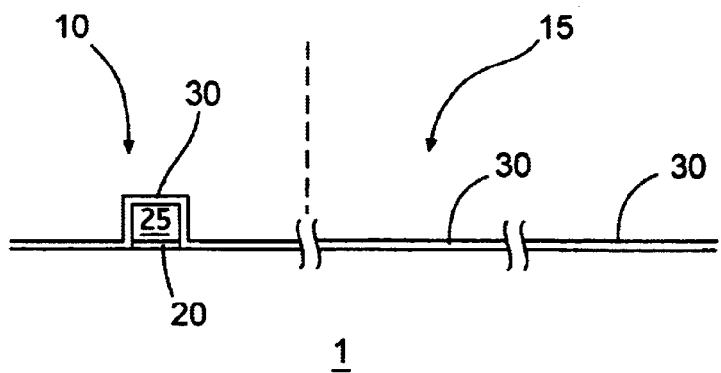
Figure 1E:
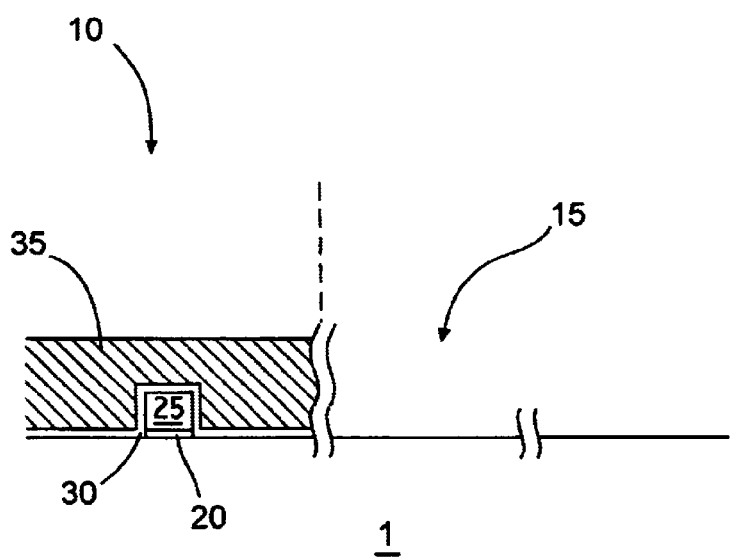

Following formation of floating gate electrode 25, the prior art method forms, e.g., by chemical vapor deposition, an ONO layer 30 over gate electrode 25 and substrate 1, as seen in FIG. 1D. Then, the gate oxide in the periphery region is formed as follows. A photoresist 35 is formed over cell region 10 to mask and protect ONO layer 30 in region 10 from an etch performed to remove ONO layer 30 in periphery region 15, as shown in FIG. 1E.

Figure 1F:
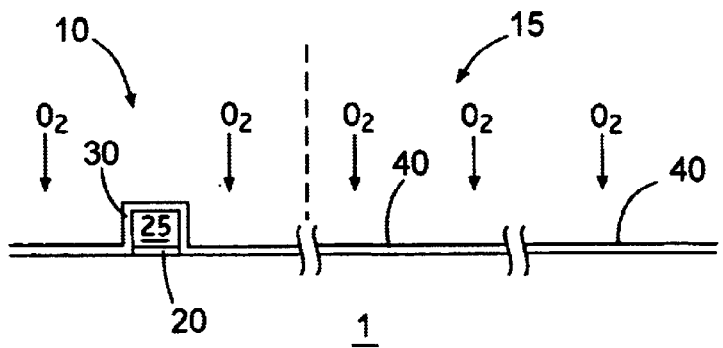

Then, photoresist 35 is removed and a thermal oxidation is performed. As illustrated in FIG. 1F, with ONO layer 30 in cell region 10 serving as a protection mask from the thermal oxidation, the exposed substrate 1 in periphery region 15 becomes thermally oxidized to form a thermal oxide layer 40 having a thickness of about 50–250 Å.

Figure 1G:
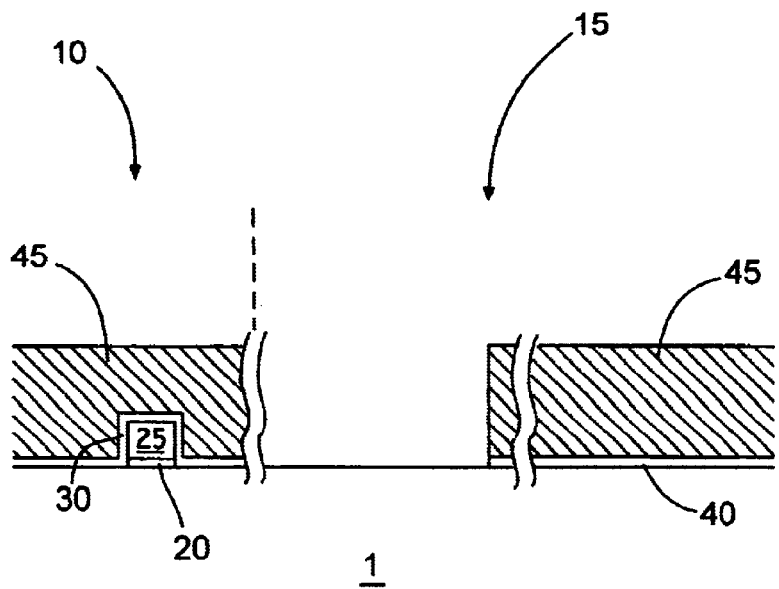

As seen in FIG. 1G, a photoresist 45 is formed and patterned over cell region 10 and over portions of periphery region 15 where a thicker oxide is desired. Photoresist 45 thus protects cell region 10 and a portion of thermal oxide 40 in periphery region 15. Then an etching step is performed using photoresist 45 as a mask, as seen in FIG. 1G, to completely remove the unmasked portion of thermal oxide layer 40 in periphery region 15 where a thinner oxide layer is desired. As mentioned above, the etching step to remove unmasked portions of oxide layer 40 may be either a dry etch or a wet etch. In the prior art method, photoresist 45 physically contacts thermal oxide layer 40 which is to become the thicker gate oxide, while the etch step removes the remaining unmasked portion of thermal oxide 40. The materials used for such photoresist typically contain many contaminants which degrade the ability of the thick gate oxide to resist long-term high voltage stresses.

Figure 1H:
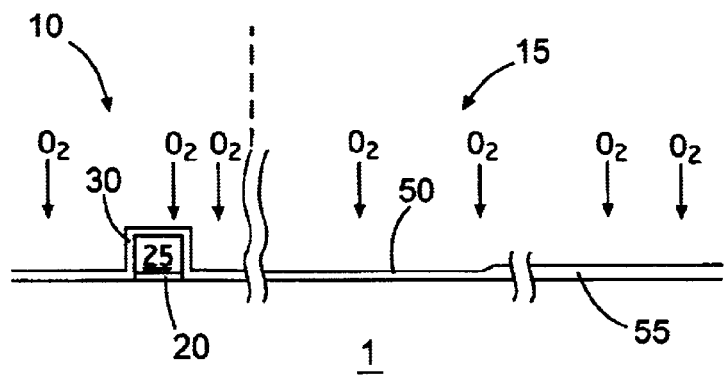

Photoresist 45 is then removed to expose ONO layer 30 in cell region 10, a portion of substrate 1 in periphery region, and the remaining portion of oxide layer 40 in periphery region 15. Then, another thermal oxidation is performed, as shown in FIG. 1H. With ONO layer 30 in cell region 10 again serving as a protection mask from the thermal oxidation, the exposed substrate 1 in a portion of periphery region 15 becomes thermally oxidized to form a thermal oxide layer 50 having a thickness of about 30–250 Å, and thermal oxide 40 in a portion of periphery region 15 becomes further thermally oxidized to form a thicker thermal oxide layer 55 having a thickness of about 100–500 Å.

Figure 1I:
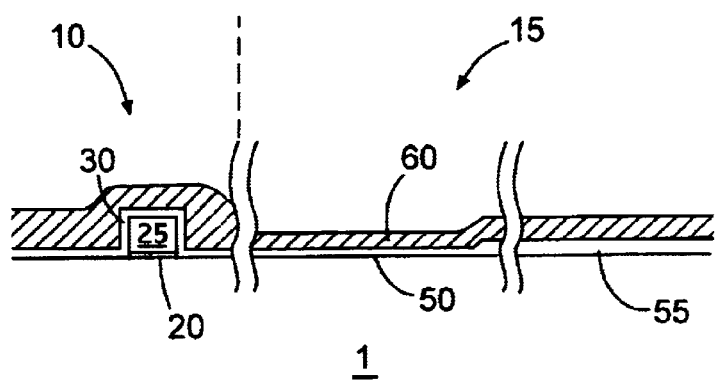
Figure 1J:
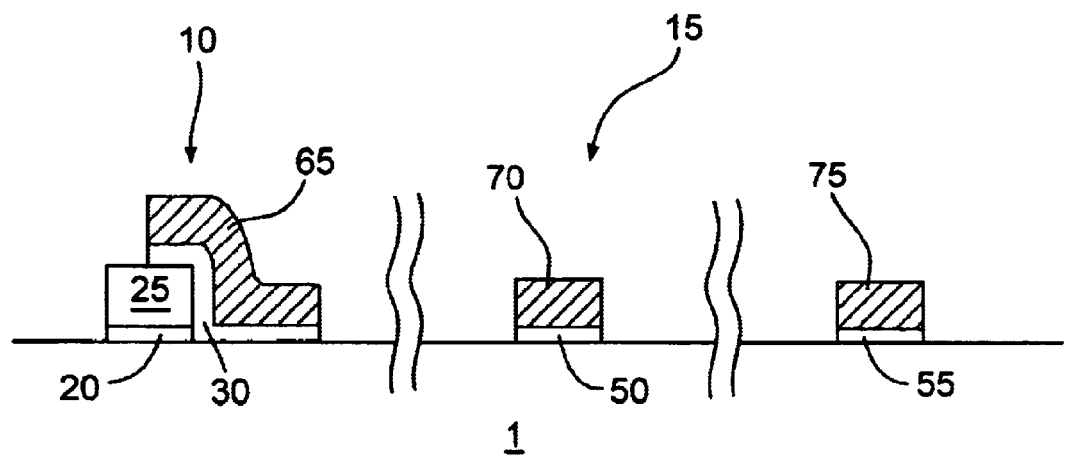
Figure 1K:
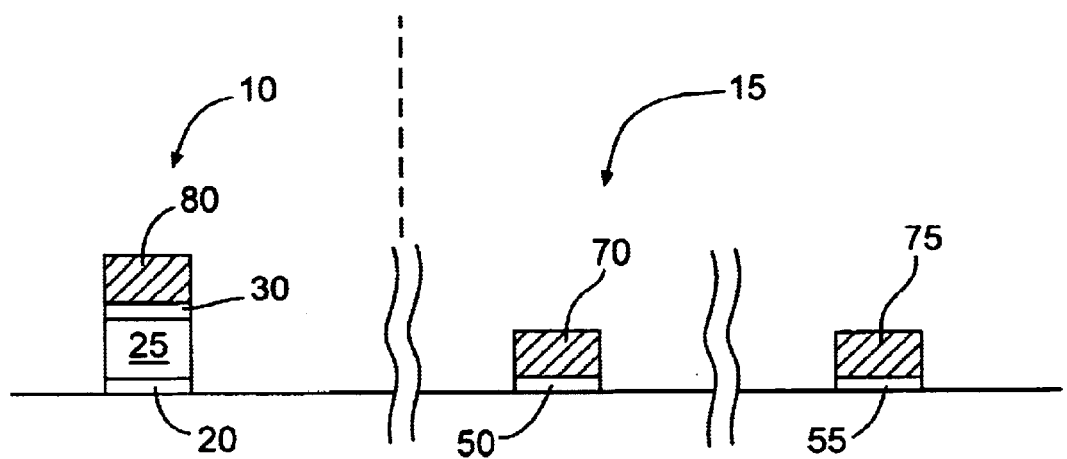

Following the thermal oxidation, a second conducting layer (e.g., polysilicon) is formed using chemical vapor deposition over ONO layer 30 in cell region 10, and over thermal oxide layer 50 and thicker thermal oxide layer 55 in periphery region 15, as seen in FIG. 1I. Of course, to improve electrode conductivity, the second conducting layer may be in situ doped or doped subsequent to deposition. Second conducting layer is then masked and patterned, and etched to form additional gate electrodes in the cell region 10 and in the periphery region 15, as seen in FIGS. 1J and 1K which show alternative embodiments of partially completed typical prior art flash EEPROMs. As seen in FIG. 1J, in cell region 10, a control gate electrode 65 is formed over part of ONO layer 30 on floating gate electrode 25 and over part of ONO layer 30 on substrate 1 for a "split gate" cell. In addition, in periphery region 15, a gate electrode 70 is formed over thin oxide layer 50 and a gate electrode 75 is formed over thicker oxide layer 55. FIG. 1K similarly shows the formation of gate electrodes 70 and 75, but shows in cell region 10 the formation of a control gate electrode 80 formed on top of ONO layer 30 on floating gate electrode 25 for a "stack gate" cell. Accordingly, the prior art method forms two different thicknesses for the gate oxide. To form a complete EEPROM device, additional steps besides those described above would be performed. For example, although not shown, source/drain regions and lightly-doped drain (LDD) regions for the transistors also are formed.

Improved Methods for Fabricating EEPROMs

FIGS. 2A–2C, FIGS. 3A–3F, and FIGS. 4A–4I illustrate improved methods of fabricating a gate oxide with different thicknesses for EEPROM devices, e.g., flash EEPROMs, according to the present invention. The present invention can be applied to form more than one or more than two layers (e.g., three, four, five, six) of differing gate oxide or dielectric thicknesses. Additionally, the Figs. generally show a method of using a fluorine bearing impurity for illustrative purposes. The fluorine bearing impurity can be replaced or combined with other impurities such as chlorine, bromine, iodine, as well as other halogens, and the like. The embodiments are shown for illustrative purposes only, and therefore should not limit the scope of the invention, as recited by the claims.

Figure 2A:
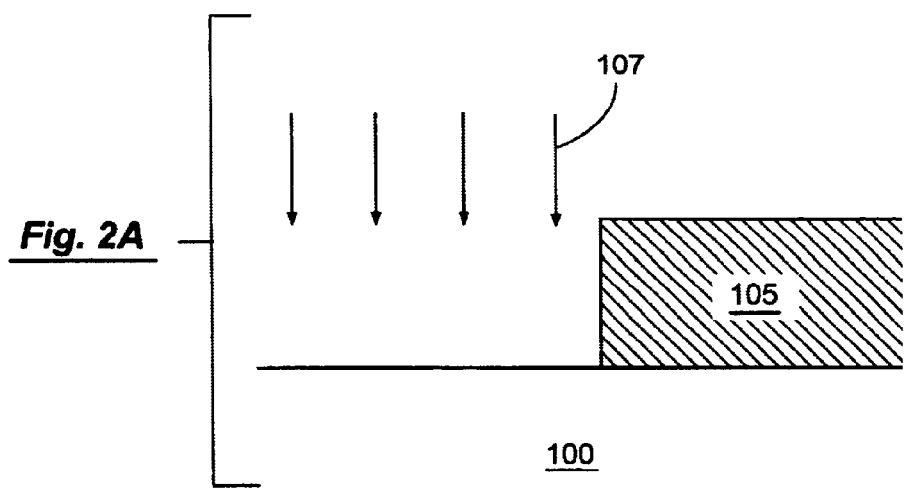
FIGS. 2A–2C are cross-sectional views of a simplified fabrication method for semiconductor devices as a general example of the principles of the present invention.
Figure 2B:
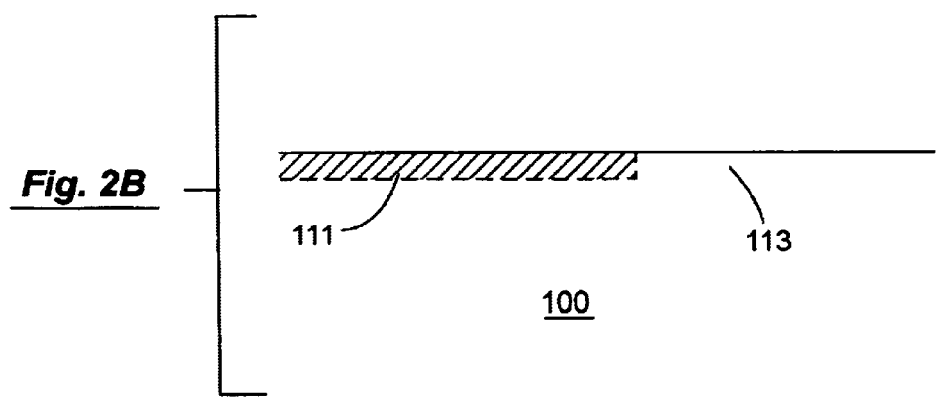
Figure 2C:
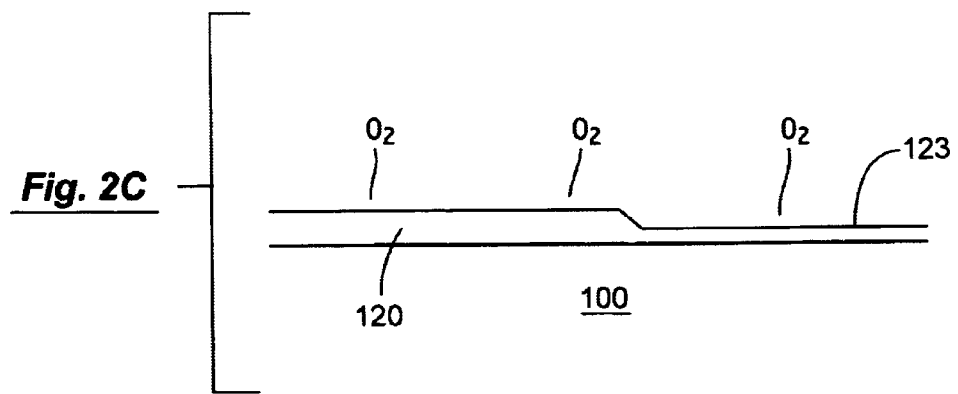
Figure 3A:
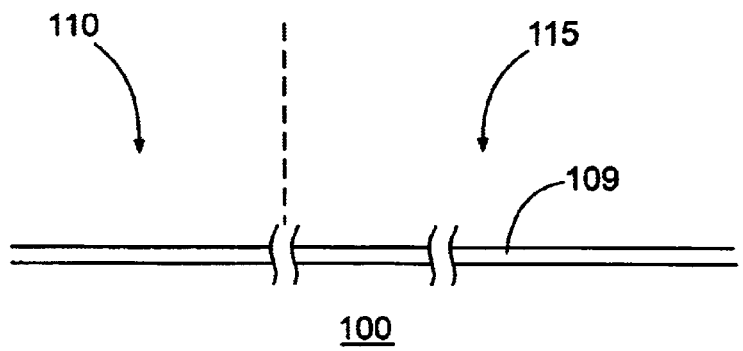
FIGS. 3A–3F illustrate an embodiment with a slight modification to the general example of FIGS. 2A–2C.
Figure 3B:
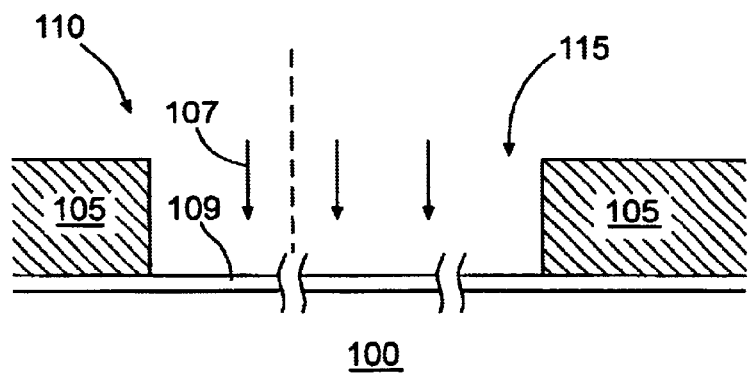
Figure 3C:
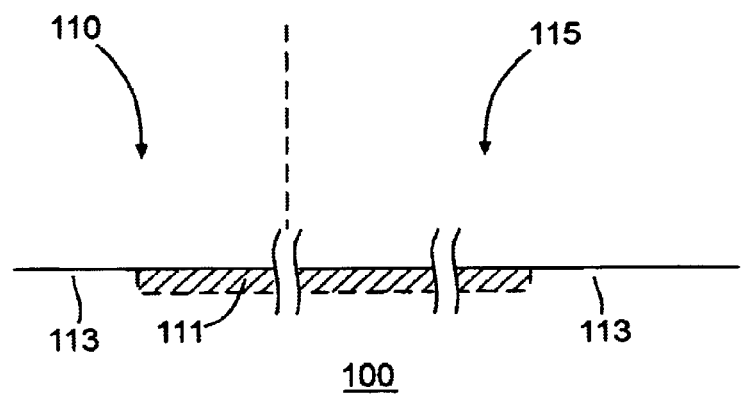
Figure 3D:
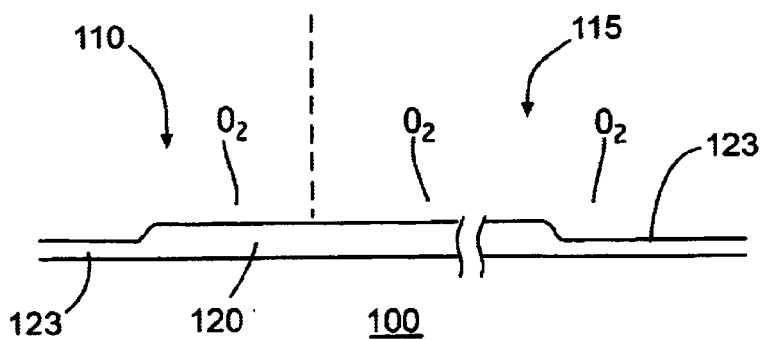
Figure 3E:
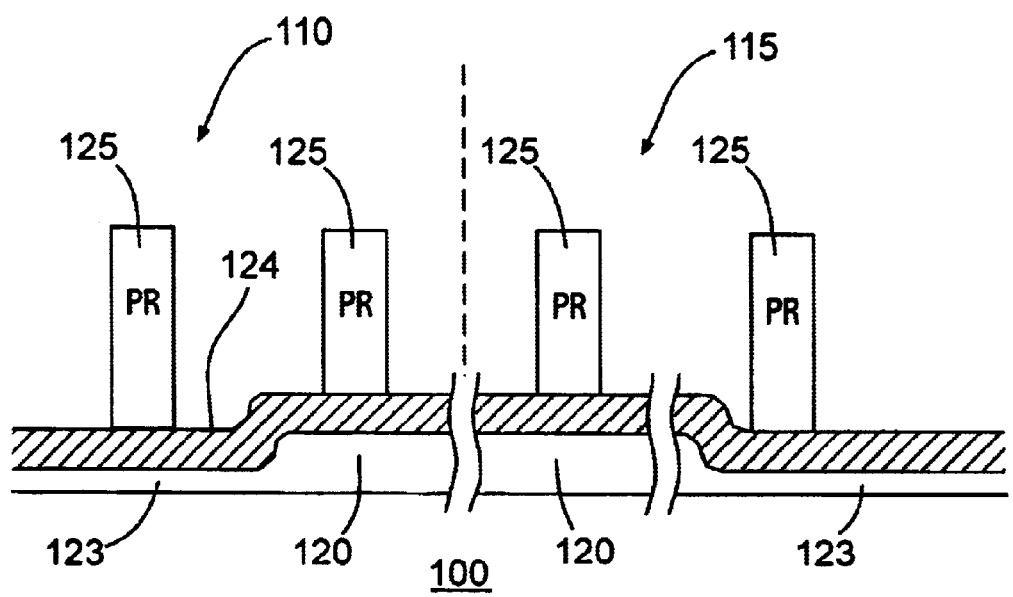
Figure 3F:
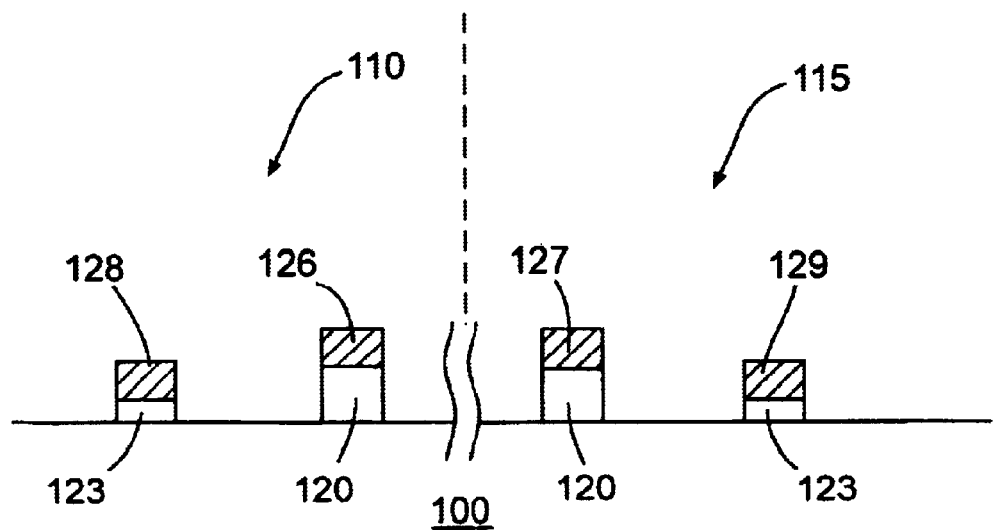

By utilizing the present invention, a thermal gate oxide layer having two or more different thicknesses or other characteristics may be formed on a semiconductor substrate 100, such as silicon, by utilizing a different concentration dosages of impurities such as fluorine bearing impurities or fluorine in the substrate to affect the oxidation rate of silicon (i.e., as the fluorine concentration increases, the oxidation rate increases). Additionally, the fluorine also shifts the threshold voltage of the transistor, and has other characteristics in some embodiments. FIGS. 2A–2C provide a general example of the principles of the present invention. As seen in FIG. 2A, substrate 100 has certain substrate regions that require a thicker gate oxide or a higher dielectric constant. Other regions can be covered by a photoresist 105 or other mask. Then fluorine-containing impurities 107 (e.g., negative fluorine ions, or other type of fluorine-containing impurities) seen in FIG. 2A may be introduced to the unmasked portions of the substrate 100. According to this example, impurities 107 may be implanted to the unmasked portions of substrate 100 at a dosage of about $1 \times 10^{14}$ to $1 \times 10^{15}$ carriers/cm2 and about 0.1 to 40 keV implant energy or greater. As shown in FIG. 2B, the implant of fluorine-containing impurities 107 forms a higher fluorine concentration region 111 in substrate 100 and a region 113 having lower or no fluorine concentration. Photoresist 105 is then removed. According to specific embodiments, a thermal oxidation process is then performed, for example, at about 780–1000° C. (degrees Celsius) and 760 torr for about 10 minutes to 5 hours (depending on the desired thickness of the oxide layers) in an oxygen-containing thermal oxidation furnace. As seen in FIG. 2C, the thermal oxidation process thus simultaneously results in a thick oxide layer 120 where the fluorine was introduced to substrate 100 and a thinner oxide layer 123 where the fluorine concentration was lower relative to region 111. FIGS. 3A–3F illustrate an embodiment with a slight modification to the general example of FIGS. 2A–2C. In a semiconductor device, such as a flash EEPROM, according to the present invention, substrate 100 will include a cell region 110 including multiple storage cell transistors (not shown), and a periphery region 115 including peripheral driver transistors, high-voltage power supply circuitry, interconnects and bonding pads, etc. For FIGS. 3A–3F, different regions are shown separated by double wavy lines to indicate the existence of other structures (e.g., isolation structures like isolation trenches or field oxide, etc.) separating the regions. As shown in FIG. 3A, a pad oxide layer 109 is formed on substrate 100, and then the mask of photoresist 105 is formed thereon and patterned to cover those areas where a thinner oxide is desired, as shown in FIG. 3B. Fluorine-containing impurities 107 are implanted into the regions of substrate 100 where a thicker oxide is desired. In this modified example, photoresist 105 is removed by a pre-clean step leaving the region 111 and region 113 covered by the pad oxide layer which is then removed to provide a cleared substrate 100 with regions 111 and 113, as shown in FIG. 3C. Then, the thermal oxidation step similar to that of FIG. 2C is performed to form oxide layers 120 and 123 having different thicknesses, as seen in FIG. 3D. As shown in FIG. 3E, a conducting layer 124 is then be deposited over oxide layers 120 and 123, masked with photoresist 125 and patterned then etched to form various gate electrodes (e.g., electrodes 126 and 127) on thicker oxide layer 120 and electrodes (e.g., electrode 128 and 129) on thinner oxide layer 123 shown in FIG. 3F, as desired. According to a specific embodiment, gate electrode 126 formed on thicker oxide layer 120 in region 110, gate electrode 128 formed on thinner oxide layer 123 in region 110, gate electrode 127 formed on thicker oxide layer 120 in periphery region 115 is used for a high-voltage MOS transistor, and gate electrode 129 formed on thinner oxide layer 123 in region 115 is used for a low-voltage MOS transistor.

Subsequent to forming the different thickness oxide layers, the remaining steps may be performed. For example of the embodiment of FIGS. 2A–2C, the first conducting layer, interpoly dielectric layer, second conducting layer and gate electrode formation steps, and additional steps would be performed, similar to those shown for FIGS. 3A–3F.

To form a complete EEPROM device, additional steps besides those described above would be performed. For example, although not shown, source/drain regions and lightly-doped drain (LDD) regions for the transistors also are formed. It should be recognized that the gate electrode may be used as a floating gate electrode and gate electrodes and as control gate electrodes in some embodiments and that gate electrode may be used as a control gate and gate electrodes and as floating gate electrodes in other embodiments, depending on the specific type of device being fabricated.

In a further aspect of the present invention, the techniques described above can be applied to a variety of device structures and cell designs. As merely an example, selected flash EEPROM devices can be defined in a cell region having an oxide of a first thickness, which is thin enough to be a gate oxide, for example. The present first oxide thickness is achieved by way of the present implantation technique. Peripheral or high voltage regions can be defined on an oxide of a second thickness that is much thicker than the first thickness to achieve desired device performance. The first oxide thickness and the second oxide thickness is defined using the techniques described herein. Details of the use of the techniques as applied to the selected EEPROM devices are described in more detail below.

Figure 4:
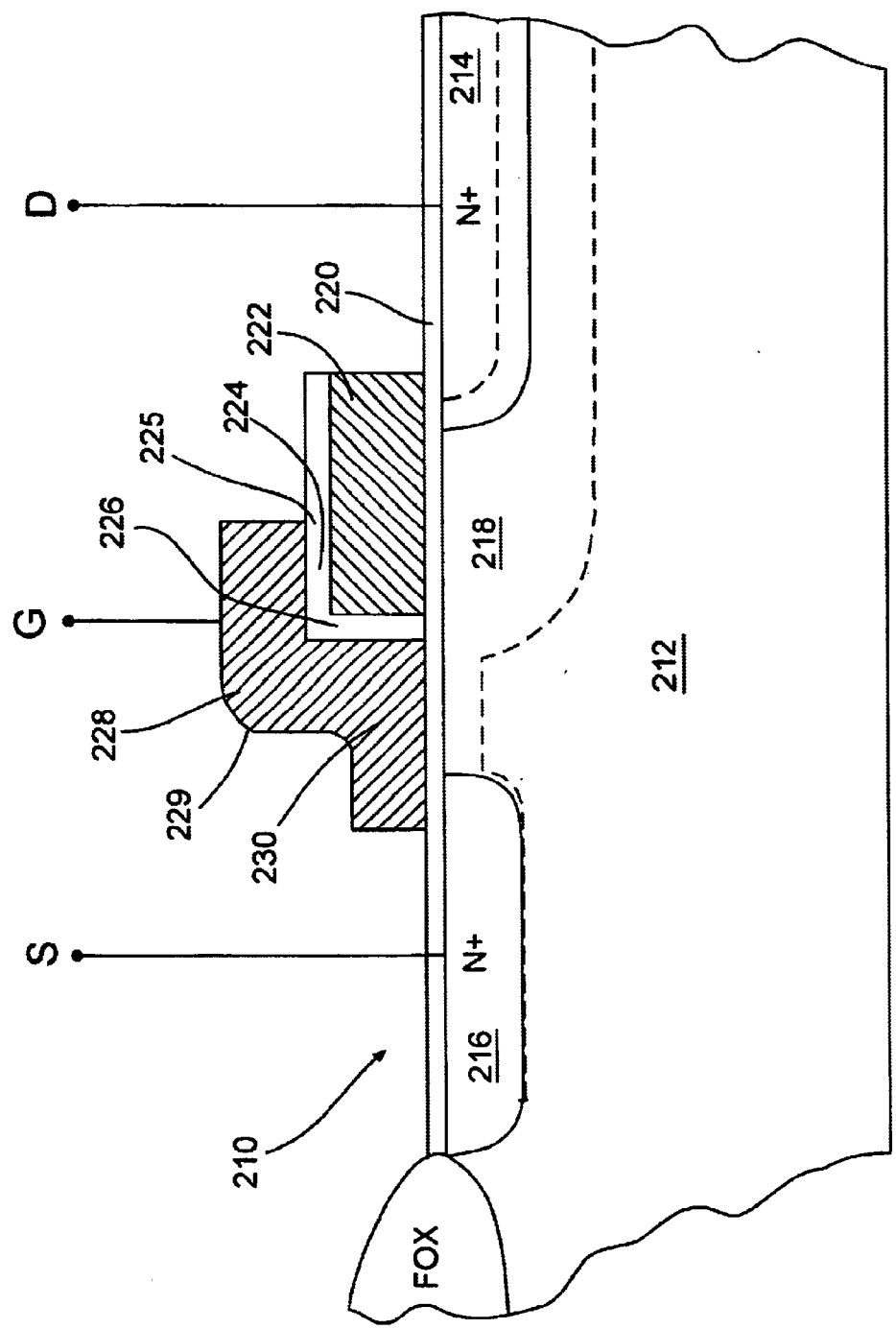
FIG. 4 illustrates a flash memory cell 210 in a partially completed EEPROM device according to a specific embodiment of the present invention.

FIG. 4 illustrates an example of a memory cell in a flash memory device according to a specific embodiment of the present invention. There is shown a single transistor non-volatile electrically alterable semiconductor memory cell 210. The cell 210 comprises a semiconductor substrate 212, such as silicon. The substrate 212, in one embodiment, can be a P-type silicon substrate with a typical doping level range from 5 to 50 U-cm, depending on the level of scaling. Within the substrate 212 are defined a source region 216 and a drain region 214 with a channel region 218 therebetween. Disposed over the source region 216, channel region 218, and drain region 214 is a first layer 220 of insulating material, on the order of, e.g., 70–200 Å angstrom of thickness. Preferably, the first insulating layer can be fabricated using the technique described above, which actually forms two insulating layers. The second insulating layer has a second thickness that is much thicker than the first insulating layer. The second thicker insulating layer can be used in, for example, high voltage devices that are used to program the device of FIG. 4. Although FIG. 4 illustrates a cell region of an exemplary device without showing the periphery region which can include an oxide layer thicker than oxide layer 220, the above-described methods of the present invention may be used to simultaneously form the different thickness oxide layers.

Disposed over the first layer 220 is a floating gate 222. The floating gate 222 is positioned over a portion of the channel region 218 and over a portion of the drain region 214. The floating gate 222 can be a polysilicon gate and in one embodiment is a re-crystallized polysilicon gate. A second insulating layer 225 has a first portion 224 disposed over the floating gate 222 and a second portion 226 disposed adjacent to the floating gate 222. The first portion 224 (top wall 224) of the second layer 225 is an insulating material and can be silicon dioxide, silicon nitride or silicon oxynitride and is on the order of, e.g., 1000–3000 Å in thickness. The second portion 226 (side wall 226) of the second layer 225 is also of an insulating material and can be silicon dioxide, silicon nitride or silicon oxynitride and is on the order of, e.g., 150–1200 Å in thickness. A control gate 229 has two portions: a first portion 228 that is disposed over the top wall 224 of the second layer 225; and a second portion 230 that is disposed over the first layer 220 and is immediately adjacent to the side wall 226 of the second layer 225. The second portion 230 of the control gate 229 extends over a portion of the source region 216 and over a portion of the channel region 218.

The dimensions of the cell 210 depend upon the process used. Thus, the foregoing dimensions for the first layer 220, side wall 226, and top wall 224 are only illustrative examples. Further, the materials, for the first layer 220 and the second layer 225 are also illustrative examples only. In general, however, the dimensions of the cell 210 are such that electrons emanating from the source region 216 are injected onto the floating gate 222 by sensing an abrupt potential drop. Further, the dimensions of cell 210 are such that negative charges from the floating gate 222 are removed by tunneling through the Fowler-Nordheim mechanism through the second layer 225 onto the control gate 229.

The particular manner of operating the cell 210 is as follows. Initially, when it is desired to erase cell 210, a ground potential is applied to the drain 214 and to the source 216. A high-positive voltage, on the order of, e.g., +15 volts, is applied to the control gate 229. Negative charges on the floating gate 222 are induced through the Fowler-Nordheim tunneling mechanism to tunnel through the second layer 225 to the control gate 229, leaving the floating gate 222 positively charged.

When selective cells 210 are desired to be programmed, a ground potential is applied to the source region 216. A positive voltage level, in the vicinity of the threshold voltage of the MOS structure defined by the control gate 229 (on the order of approximately of +1 volt, for example), is applied to the control gate 229. A positive high voltage, on the order of, e.g., +12 volts, is applied to the drain region 214. Electrons generated by the source region 216 will flow from the source region 216 towards the drain region 214 through a weakly-inverted channel region 218. When the electrons reach the region where the control gate 229 meets the side wall 226, the electrons see a steep potential difference approximately equal to the drain voltage, across the surface region defined by the gap of the side wall 226. The electrons will accelerate and become heated and some of them will be injected into and through the first insulating layer 220 onto the floating gate 222.

The injection of electrons onto the floating gate 222 will continue until the charged floating gate 222 can no longer sustain a high surface potential beneath, to generate hot electrons. At that point, the electrons or the negative charges in the floating gate 222 will "turn off" the electrons from flowing from the source region 216 onto the floating gate 222.

Finally, in a read cycle, ground potential is applied to the source region 216. Conventional transistor read voltage, such as +2 volts and +5 volts, are applied to the drain region 214 and to the control gate 229, respectively. If the floating gate 222 is positively charged (i.e., the floating gate is discharged), then the channel region 218 directly beneath the floating gate 222 is turned on. When the control gate 229 is raised to the read potential, the region of the channel region 218 directly beneath the second portion 230 is also turned on. Thus, the entire channel region will be turned on, causing electrical current to flow from the drain region 214 to the source region 216. This would be the "1" state.

On the other hand, if the floating gate 222 is negatively charged, the channel region 218 directly beneath the floating gate 222 is either weakly turned on or is entirely shut off. Even when the control gate 229 and the drain region 214 are raised to the read potential, little or no current will flow through the portion of the channel region directly beneath the floating gate 222. In this case, either the current is very small compared to that of the "1" state or there is no current at all. In this manner, the cell 210 is sensed to be programmed at the "0" state.

As noted, the device of FIG. 4 is commonly programmed by way of a high voltage device, which applies a high voltage to selected regions of the device to introduce electrons into the floating gate, for example. The high voltage device is often defined in a peripheral or non-cell region of the semiconductor integrated circuit. In a specific embodiment, the high voltage device is fabricated on an oxide layer of a second thickness, which is much thicker than the first thickness. The oxide of first thickness and second thickness can be formed using the techniques described above according to a preferred embodiment of the present invention.

Figure 5:
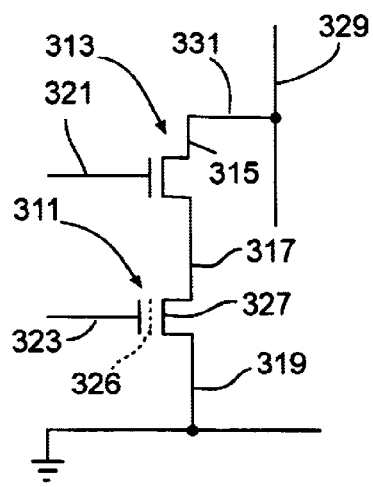
FIG. 5 is a schematic circuit diagram of a memory cell in a partially completed EEPROM device according to another specific embodiment of the present invention.
Figure 6:
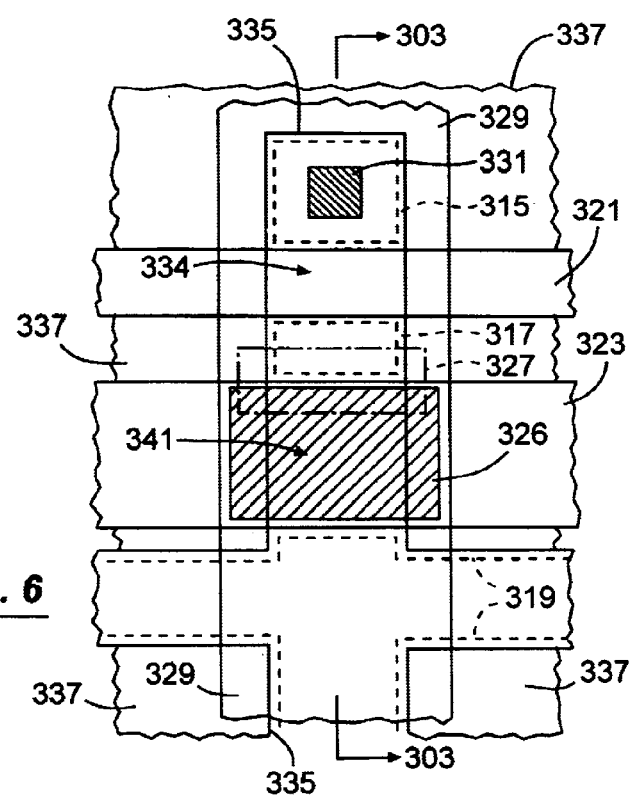
FIG. 6 is a top plan view of the memory cell of FIG. 5.
Figure 7:
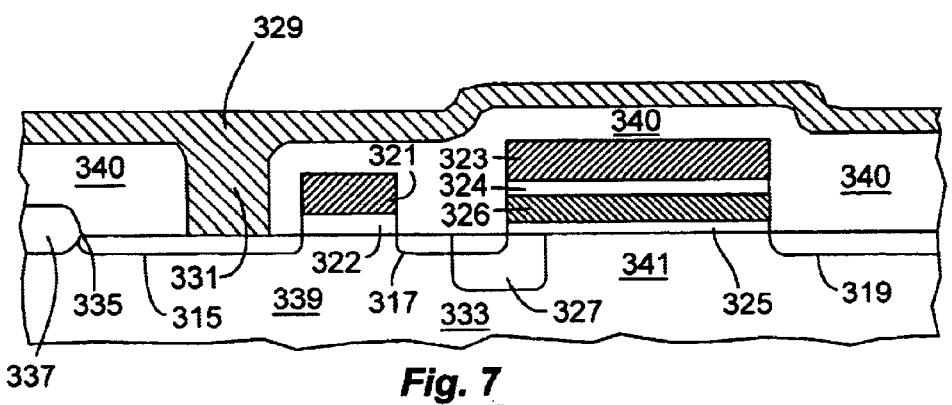
FIG. 7 is a side cross-sectional view taken along the line 303—303 in FIG. 5.

In accordance with another specific embodiment of the present invention, which can use the differing oxide thicknesses, FIG. 5 is a schematic circuit diagram of a memory cell. With reference to FIG. 5, a memory cell of the present invention includes a memory device 311 and a field effect transistor 313 which allows selection of memory device 311 from among other memory cells. A drain 315 of selection transistor 313 is connected via a metal contact 331 to a read line 329. Selection transistor 313 and memory device 311 are connected together in series at a node 317 which serves as both a source for selection transistor 313 and a drain for memory device 311. A source 319 of memory device 311 connects to a common source line which in turn is coupled to ground. The gate 321 of selection transistor 313 is electrically connected to a word select line. The control gate 323 of memory device 311 is connected to a sense enable and program line. The circuit of FIG. 5 also includes in the memory device 311 a floating gate 326 (as represented in FIG. 5 by a dashed line), separated from the substrate by only a thin oxide layer, which can be the first oxide layer of a first thickness made by way of the above techniques. A program and erase implant 327 is provided in memory device 311 proximate to the device 317. The thin oxide layer together with the program and erase implant 327 permit rapid erasure of the memory device 311 electrically in a few milliseconds, instead of the usual twenty minutes or so with ultra-violet (UV) light with the thicker oxide layer under the floating gate of prior memory devices. The implant 327 also enables more efficient reprogramming to occur. FIG. 6 is a top plan view of the memory cell of FIG. 5, and FIG. 7 is a side cross-sectional view taken along the line 303—303 in FIG. 6. With reference to FIGS. 6 and 7, a semiconductor chip having an array of memory cells comprises a semiconductor substrate 333 with active memory areas 335 therein. A field isolation oxide layer 337 is present over all non-active areas outside of memory areas 335. Three spaced-apart implants 315, 317 and 319 are located in memory area 335 with channel areas 339 and 341 defined therebetween. Implant 315 forms a drain for the selection transistor 313 in the circuit of FIG. 5. Implant 317 forms a node finctioning as both a source for selection transistor 313 and a drain for memory device 311 in FIG. 6. Implant 319 forms a source for memory device 311. Typically, substrate 333 is P-type and implants 315, 317 and 319 are N-type.

A program and erase implant 327 is also present in the active memory area 335 of substrate 333. Implant 327 overlaps part of node implant 317, extending into channel 341 between implants 317 and 319 of the memory device 311. Implant 327 is typically N-type and may be formed by either phosphorus or arsenic ion implantation followed by diffusion, as explained below. A thin oxide layer 325 is disposed over channel 341 between implants 317 and 319, including over the portion of program and erase implant 327 which extends into channel 341, in active area 335. Typically, thin oxide layer 325 is between 70–150 Å thick. The remainder of active area 335 between field oxide layer 337 has an oxide layer 322 over it, which can be the second oxide or thicker oxide layer made by way of the present technique. Oxide layer 322 is thicker than thin oxide layer 325, typically about 300–500 Å thick. It is recognized that the above-described methods of the present invention can be used to simultaneously form thin oxide layer 325 and thicker oxide layer 322 within the cell region of the exemplary device.

A polysilicon floating gate 326 is disposed on thin oxide layer 325 and extends over that portion of program and erase implant 327 that is beneath thin oxide layer 325.

An interpoly oxide layer 324 is disposed on floating gate 326 and a polysilicon sense gate 323 is situated above interpoly oxide layer 324. A polysilicon select gate 321 is disposed above channel 339 between implants 315 and 317. The entire wafer is covered with an insulating glass layer 340 with vias for contacts 331 therein. A layer of conductive lines 329 is disposed on top of glass layer 340.

Similar to the previous embodiment, the device of FIGS. 5–7 are commonly programmed by way of a high voltage device, which applies a high voltage to selected regions of the device to introduce electrons into the floating gate, for example. The high voltage device is often defined in a peripheral or non-cell region of the semiconductor integrated circuit. In a specific embodiment, the high voltage device is fabricated on an oxide layer of a second thickness, which is much thicker than the first thickness. The oxide of first thickness and second thickness can be formed simultaneously using the techniques described above according to a preferred embodiment of the present invention.

Figure 8:
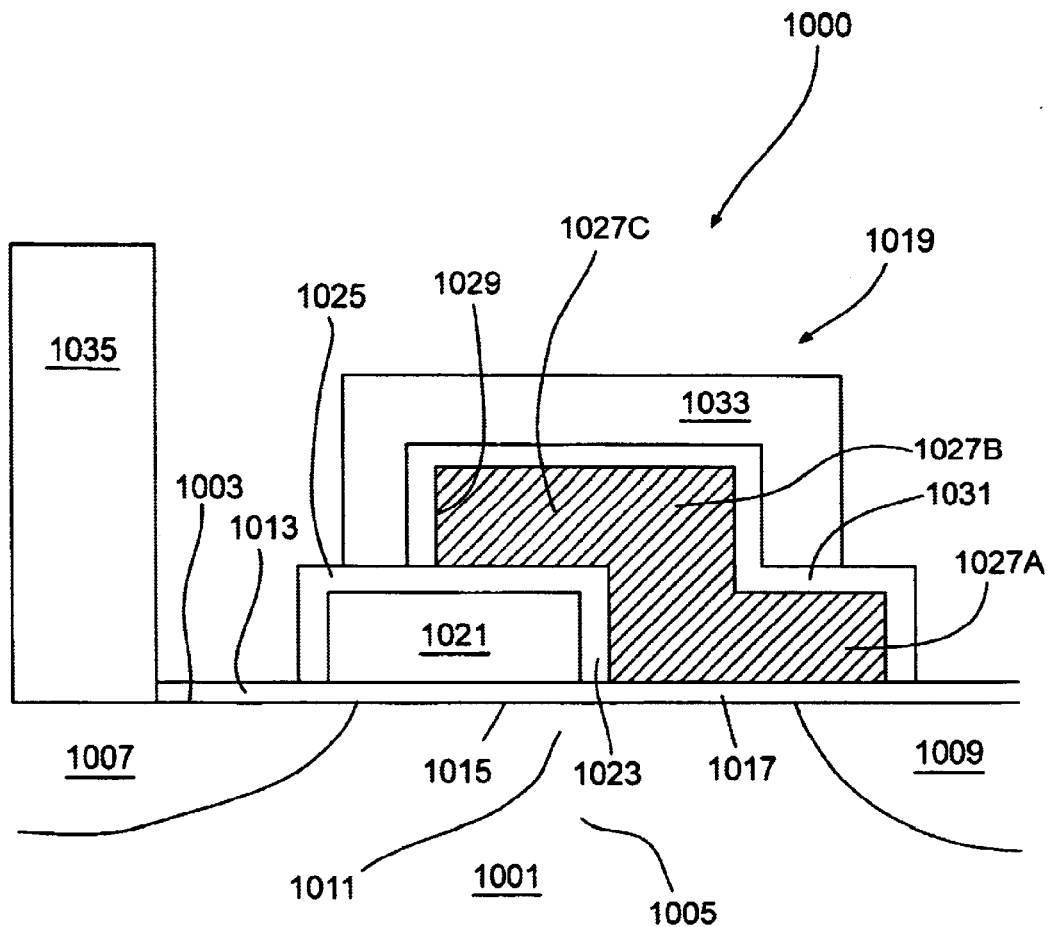
FIG. 8 illustrates an improved flash memory cell 1000 in a partially completed EEPROM device according to still another specific embodiment of the present invention.

In another specific embodiment, the present invention can also be applied to an improved flash memory cell 1000, such as the one shown in the simplified diagram of the FIG. 8. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011 . These dielectric layers can be made using a suitable material including silicon dioxide, silicon nitride, silicon oxynitride, and others. In the context of this embodiment, the gate dielectric and tunnel dielectric layers are made of high quality silicon dioxide. The tunnel dielectric layer is substantially uniform and substantially pinhole free. Additionally, the tunnel dielectric layer can withstand numerous programming and erase cycles. Preferably, the tunnel dielectric layer is the oxide layer of first thickness, which is thinner than the oxide layer of second thickness, which can be used in, for example, high voltage devices in a peripheral region or non-cell region of the integrated circuit.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a POC13 compound or the like. Alternatively, the split gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g., control gate, floating gate. The select gate also has a channel region ranging from about 0.2 μm and less, or about 1.0 μm and less, but is not limited to these ranges. Additionally, the select gate has a thickness of about 500 Å and less, or about 3500 Å and less, but is not limited to these ranges.

The gate structure 1019 also includes a split floating gate 1027 overlying a portion of the upper surface of the substantially planar substrate, and also overlaps a portion of the select gate 1021, which is defined overlying the planar surface of the substrate. That is, the split floating gate 1027 is defined overlying insulating layer 1025, which forms overlying the top surface of the select gate. The split gate also overlies an edge(s) including sidewall spacer 1023 of the select gate. The split gate 1027 also has an edge 1029 overlying a region on the top surface of the select gate. Split floating gate 1027 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a POC13 compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." The dielectric layer can also be a single nitride layer or a single oxide layer depending upon the application. Either CVD or thermal techniques can be used to form the dielectric layer or layers. The dielectric layer insulates and isolates the floating gate from a control gate 1033.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a POC13 compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region. These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

In the present embodiment, the gate coupling ratio or GCR is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

The device of FIG. 8 is commonly programmed by way of a high voltage device, which applies a high voltage to selected regions of the device to introduce electrons into the floating gate, for example. The high voltage device is often defined in a peripheral or non-cell region of the semiconductor integrated circuit. In a specific embodiment, the high voltage device is fabricated on an oxide layer of a second thickness, which is much thicker than the first thickness. The oxide of first thickness and second thickness can be formed using the techniques described above according to a preferred embodiment of the present invention.

In one embodiment, the present memory cell can be programmed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiments described above are merely examples of flash memory devices. Integrated circuits include one or more of these devices in a cell. Thousands, millions, billions, and even trillions of these devices are formed in a single integrated circuit chip. Thus, the integrated circuit chip can have up to 4 Meg., 16 Meg. 64 Meg. 256 Meg., 1 Gig. or more devices on a single sliver of silicon. The channel length of these devices range from about 0.4 μm to 0.25 μm and less. The flash memory device can be formed in a stand alone integrated circuit chip, commonly termed the flash memory chip, in some embodiments. Alternatively, the flash memory device can be integrated into a microprocessor, microcomputer, digital signal processor, application specific integrated circuit, and the like. Of course, the number of cells and design size depend highly upon the application. While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of forming a semiconductor device comprising:
    providing a semiconductor substrate having a first region where a first oxide layer thickness is desired and a second region where a second oxide layer thickness is desired, wherein said first oxide layer thickness is greater than said second oxide layer thickness;
    introducing halogen-containing impurities into an exposed surface of said semiconductor substrate to form a higher halogen concentration in said first region than in said second region;
    performing an oxidizing process on said semiconductor substrate to simultaneously form said first oxide layer thickness at said first region and said second oxide layer thickness at said second region; and
    forming a first memory gate electrode on said second oxide layer thickness, said second oxide layer thickness formed on said semiconductor substrate in a memory region;
    wherein said semiconductor substrate also includes a third region where a third oxide layer thickness is desired, and wherein introducing said halogen-containing impurities also introduces halogen-containing impurities such that a different halogen concentration is formed in said third region than in said first region and in said second region.

2. The method of claim 1 wherein introducing said halogen-containing impurities comprises an ion implantation.

3. The method of claim 1 wherein introducing said halogen-containing impurities comprises introducing halogen-containing impurities into said first region and wherein said second region has no halogen concentration therein.

4. The method of claim 1 wherein said halogen-containing impurities are selected from flourine bearing impurities, chlorine bearing impurities, bromine bearing impurities, and iodine bearing impurities.

5. The method of claim 1 wherein said semiconductor device comprises a flash EEPROM semiconductor device.

6. The method of claim 1 wherein said first memory gate electrode comprises a floating gate electrode.

7. The method of claim 6 wherein said first memory gate electrode is part of a stack gate cell.

8. The method of claim 6 wherein said first memory gate electrode is part of a split gate cell.

9. The method of claim 1 wherein said first memory gate electrode comprises a control gate electrode.

10. The method of claim 9 wherein said first memory gate electrode is part of a stack gate cell.

11. The method of claim 9 wherein said first memory gate electrode is part of a split gate cell.

12. A method of forming a semiconductor device comprising:
    providing a semiconductor substrate having a first semiconductor surface where a first oxide layer thickness is desired and a second semiconductor surface where a second oxide layer thickness is desired, wherein said first semiconductor surface is adjacent said second semiconductor surface;
    introducing halogen-containing impurities into said semiconductor substrate to form a higher halogen concentration in said semiconductor substrate below said first semiconductor surface than in said semiconductor substrate below said second semiconductor surface;
    performing an oxidizing process on said semiconductor substrate to simultaneously form said first oxide layer thickness disposed above said first semiconductor surface and said second oxide layer thickness disposed above said second semiconductor surface; and
    wherein introducing said halogen-containing impurities comprises introducing halogen-containing impurities into said semiconductor substrate below said first semiconductor surface at a first concentration and introducing halogen-containing impurities into said semiconductor substrate below said second semiconductor surface at a second concentration, said first concentration greater than said second concentration, both said first and second concentrations formed of a dosage of said halogen-containing impurities greater than about $1\times10^{14}$ carriers/cm$^2$ and less than about $1\times10^{15}$ carriers/cm$^2$.

13. The method of claim 12 wherein said halogen-containing impurities promote oxide growth on said semiconductor substrate such that said first oxide layer thickness is greater than said second oxide layer thickness.

14. The method of claim 12 wherein at least one of said first and second concentrations formed of a dosage of said halogen-containing impurities greater than about $1\times10^{14}$ carriers/cm$^2$ and less than about $1\times10^{15}$ carriers/cm$^2$.

15. A method of forming a semiconductor integrated circuit, said method comprising:

provioding a semiconductor substrate, said semiconductor substrate comprising a memory cell region, a first region for a MOS transistor, and a second region;

forming a gate dielectric layer comprising an oxide overlying said semiconductor substrate including said first region and said second region;

selectively implanting halogen-containing impurities through said gate dielectric layer and into said first region and said second region, such that said first region has a greater halogen concentration than said second region, said halogen-containing impurities in said second region formed of a dosage greater than about $1\times10^{14}$ carriers/cm$^2$ and less than about $1\times10^{15}$ carriers/cm$^2$; and simultaneously forming a first thickness of dielectric material overlying said first region and forming a second thickness of dielectric material overlying said second region by an oxidizing process, wherein said halogen-containing impurities in said second region promote formation of said second thickness of dielectric material.

16. The method of claim 15 wherein said halogen-containing impurities are selected from fluorine bearing impurities, chlorine bearing impurities, bromine bearing impurities, and iodine bearing impurities.

17. The method of claim 15 wherein said forming said first and second thickness of dielectric material comprises an anneal process performed at about 780 to about 1000 degrees Celsius, and for a duration of about ten (10) minutes to about five (5) hours.

18. The method of claim 17 wherein said anneal process is further performed at a pressure of about 760 Torr.

19. A method of forming a semiconductor integrated circuit, said method comprising:

providing a semiconductor substrate, said semiconductor substrate comprising a memory cell region, a first region for a MOS transistor, and a second region;

forming a gate dielectric layer comprising an oxide overlying said semiconductor substrate including said first region and said second region;

selectively implanting halogen-containing impurities through said gate dielectric layer and into said second region;

simultaneously forming a first thickness of dielectric material overlying said first region and forming a second thickness of dielectric material overlying said second region by an oxidizing process, wherein said halogen-containing impurities in said second region promote formation of said second thickness of dielectric material; and forming a third thickness of dielectric material overlying a third region, said third region being spatially apart from said first region and said second region.

20. A method of forming a semiconductor device comprising:

providing a semiconductor substrate having a first semiconductor surface area where a first oxide layer thickness is desired, a second semiconductor surface area where a second oxide layer thickness is desired, and a third semiconductor surface area where a third oxide layer thickness is desired, wherein said first and second semiconductor surface areas are contiguous;

introducing a halogen-containing impurities into said semiconductor substrate to form a higher halogen concentration in a first volume of said semiconductor substrate below said first semiconductor surface area than in a second volume of said semiconductor substrate below said second semiconductor surface area, and a different halogen concentration in a third volume of said semiconductor substrate below said third semiconductor surface area than in said first volume and said second volume, each of said higher halogen concentration and said different halogen concentration; and performing an oxidizing process on said semiconductor substrate to simultaneously form said first oxide layer thickness at said first semiconductor surface area and said second oxide layer thickness at said second semiconductor surface area.

21. The method of claim 20 wherein said performing an oxidizing process also simultaneously forms said third oxide layer thickness at said third semiconductor surface area.

22. A method of forming a semiconductor device, the method comprising:

providing a substrate having a first region and a second region and a third region;

introducing halogen-containing impurities into the substrate to form a higher concentration in the first region than in the second region;

placing the substrate in an oxidizing environment, wherein a thicker oxide layer forms over the first region where the halogen-containing impurities are located than over the second region or over the third region, the third region oxide layer thickness being different from the first and second region thicknesses;

in a single step, forming a conductive layer disposed above the first region and the second region; and removing portions of the oxide layer and the conductive layer to form gate structures disposed over the substrate.

* * * * *